United States Patent
Jang et al.

(10) Patent No.: US 8,104,490 B2
(45) Date of Patent: Jan. 31, 2012

(54) SUBSTRATE TREATING APPARATUS AND METHOD OF MANUFACTURING THE SAME

(75) Inventors: Sung-Ho Jang, Chungcheongnam-do (KR); Byung-Man Kang, Chungcheongnam-do (KR)

(73) Assignee: Semes Co., Ltd., Chungcheongnam-do (KR)

(*) Notice: Subject to any disclaimer, the term of this patent is extended or adjusted under 35 U.S.C. 154(b) by 236 days.

(21) Appl. No.: 12/288,831

(22) Filed: Oct. 23, 2008

(65) Prior Publication Data

US 2009/0101180 A1 Apr. 23, 2009

(30) Foreign Application Priority Data

Oct. 23, 2007 (KR) .................. 10-2007-0106548

(51) Int. Cl.
*B08B 3/02* (2006.01)
(52) U.S. Cl. .................. 134/186; 134/200; 134/902
(58) Field of Classification Search .................. 134/200, 134/902, 201
See application file for complete search history.

(56) References Cited

U.S. PATENT DOCUMENTS

| | | | |
|---|---|---|---|
| 5,402,807 A * | 4/1995 | Moore et al. .................... | 134/61 |
| 5,611,655 A * | 3/1997 | Fukasawa et al. ............ | 414/217 |
| 5,733,024 A * | 3/1998 | Slocum et al. ............. | 312/223.2 |
| 5,843,850 A * | 12/1998 | Shin et al. ...................... | 438/757 |
| 5,950,643 A * | 9/1999 | Miyazaki et al. ............. | 134/25.4 |
| 6,342,137 B1 * | 1/2002 | Woodruff et al. ........ | 204/297.06 |
| 6,478,035 B1 * | 11/2002 | Niuya et al. .................. | 134/95.2 |
| 6,844,274 B2 * | 1/2005 | Yoshioka et al. ............. | 438/800 |
| 6,937,917 B2 | 8/2005 | Akiyama et al. | |
| 6,945,746 B2 | 9/2005 | Yamagishi et al. | |
| 7,371,306 B2 * | 5/2008 | Davis et al. ............... | 156/345.22 |
| 7,393,439 B2 * | 7/2008 | McHugh et al. ............. | 204/273 |
| 7,399,713 B2 * | 7/2008 | Aegerter et al. ............. | 438/745 |
| 7,681,521 B2 * | 3/2010 | Nishibayashi .................. | 118/66 |
| 7,850,817 B2 * | 12/2010 | Wakabayashi et al. .. | 156/345.12 |
| 2005/0105991 A1 * | 5/2005 | Hofmeister et al. .......... | 414/217 |

FOREIGN PATENT DOCUMENTS

| | | | |
|---|---|---|---|
| JP | H09-44259 A | | 9/1997 |
| JP | H11-87456 A | | 3/1999 |
| JP | H11-233590 A | | 8/1999 |
| JP | 2003-243481 | * | 8/2003 |
| JP | 2003-260422 A | | 9/2003 |
| JP | 2006-019584 A | | 1/2006 |
| JP | 2006-245508 | | 9/2006 |
| JP | 2007-273510 A | | 10/2007 |
| KR | 10-2000-0023597 | | 4/2000 |
| KR | 10-2004-0054517 | | 6/2004 |

OTHER PUBLICATIONS

European Patent Office 0 824 266 Aug. 1997.*
European Patent Office 1 182 695 Aug. 2001.*
WIPO WO 91/07550 May 1991.*
Notice of Interim dated May 10, 2010 pertaining to Patent No. 0929817 Invalidation.

* cited by examiner

*Primary Examiner* — Frankie L Stinson (74) *Attorney, Agent, or Firm* — Jenkins, Wilson, Taylor & Hunt, P.A.

(57) ABSTRACT

Provided are a substrate treating apparatus and a method of manufacturing the substrate treating apparatus. Processing units of a process equipment are modularized, and the modularized processing units are detachably disposed in a main frame. According to this characteristic, work time and work effort required for manufacturing the process equipment can be reduced. In addition, maintenance/repair of each of the processing units can be further easily performed.

18 Claims, 7 Drawing Sheets

SUBSTRATE TREATING APPARATUS AND METHOD OF MANUFACTURING THE SAME

CROSS-REFERENCE TO RELATED APPLICATION

This U.S. non-provisionial patent application claims priority under 35 U.S.C. §119 of Korean Patent Application No. 10-2007-0106548, filed on Oct. 23, 2007, the entire contents of which are hereby incorporated by reference.

BACKGROUND OF THE INVENTION

The present invention disclosed herein relates to a substrate treating apparatus and a method of manufacturing the same, and more particularly, a substrate treating apparatus of a module assembly type and a method of manufacturing the same.

In a manufacture of a semiconductor device, various materials are deposited in thin film forms onto a wafer, and then patterned to form the semiconductor device. For this, various different processes such as a deposition process, an etching process, a cleaning process, and a drying process are required. During each of the processes, the wafer is loaded/treated into/in a process chamber having an optimum condition for the corresponding process.

In recent, with the tendency toward miniaturization and high integration of semiconductor devices, a highly accurate and complicated process and a large-diameter wafer are required. Thus, in terms of improvement of throughput accompanied with increase of combined processes or implementation of single wafer processing, a semiconductor manufacturing apparatus using a multi-chamber method is currently in the spotlight.

The semiconductor manufacturing apparatus of the multi-chamber method includes process equipment and an equipment front end module (EFEM) transferring wafers in and out of the process equipment. The process equipment includes a loading unit/an unloading unit, an indexing robot, a buffer unit, process chambers, and a substrate transfer robot.

SUMMARY OF THE INVENTION

The present invention provides a substrate treating apparatus that modularizes each of components in order to easily assemble/disassemble and maintenance/repair a process equipment and a method of manufacturing the same.

The present invention is not limited thereto, and further another objects of the present invention will be easily understood by the person skilled in the art by referring to the following description.

Embodiments of the present invention provide substrate treating apparatuses including: a process equipment in which substrate treating processes are performed; and an equipment front end module disposed at a front side of the process equipment, the equipment front end module loading/unloading a substrate into/from the process equipment, wherein the process equipment includes: a main frame; and a plurality of processing units detachably disposed on the main frame, the plurality of processing units being provided in a module form that parts interacting according to functions of the substrate treating processes are disposed within one independent housing.

In some embodiments, the processing units may include: a substrate transfer unit disposed perpendicular to the equipment front end module, the substrate transfer unit transferring the substrate; and a plurality of substrate treating units parallelly disposed at both sides of the substrate transfer unit, the plurality of substrate treating units treating the substrate.

In other embodiments, the processing units may further include a buffer unit disposed between the substrate transfer unit and the equipment front end module and providing a space in which the substrate to be loaded/unloaded into/from the process equipment temporarily stays.

In still other embodiments, each of the substrate treating units may include: a housing; upper and lower chambers in which the substrate treating processes are performed, the upper and lower chambers being vertically disposed inside the housing; and a treatment fluid supply member that supplies a treatment fluid for treating the substrate to the upper and lower chambers and discharges the treatment fluid used for treating the substrate from the upper and lower chambers, the treatment fluid supply member being disposed under the lower chamber disposed inside the housing.

In even other embodiments, the processing units may further include a treatment fluid distribution unit that distributes the treatment fluid into the treatment fluid supply member of each of the substrate treating units, the treatment fluid distribution unit being disposed perpendicular to an end of the substrate transfer unit.

In yet other embodiments, the substrate transfer unit may have a duplex structure so that the substrate transfer unit corresponds to the upper chamber and the lower chamber of the substrate treating units.

In further embodiments, the main frame may be a space form composed of linear structural materials.

In other embodiments of the present invention, substrate treating apparatuses include: a process equipment in which a single wafer type substrate cleaning process is performed; and an equipment front end module disposed at a front side of the process equipment, the equipment front end module loading/unloading the substrate into/from the process equipment, wherein the process equipment includes: a main frame having a space form composed of linear structural materials; and a plurality of processing units detachably disposed on the main frame, the plurality of processing units being provided in a module form that parts interacting according to functions of substrate cleaning processes are disposed within one independent housing.

In some embodiments, the processing units may include: a substrate transfer unit disposed perpendicular to the equipment front end module, the substrate transfer unit transferring the substrate; and a plurality of cleaning units parallelly disposed at both sides of the substrate transfer unit, the plurality of cleaning units cleaning the substrate.

In other embodiments, the processing units may further include a buffer unit disposed between the substrate transfer unit and the equipment front end module and providing a space in which the substrate to be loaded/unloaded into/from the process equipment temporarily stays.

In still other embodiments, each of the cleaning units may include: a housing; upper and lower cleaning chambers vertically disposed inside the housing, the upper and lower cleaning chambers cleaning the substrate using a single wafer processing method; and a treatment fluid supply member that supplies a treatment solution to the upper and lower cleaning chambers and discharges the treatment solution used for cleaning the substrate from the upper and lower cleaning chambers, the treatment solution supply member being disposed under the lower cleaning chamber disposed inside the housing.

In even other embodiments, the treatment fluid supply member may include: a circulation line circulating the treatment fluid into the upper and lower cleaning chambers; and a pump, a filter, and a heater disposed on the circulation line.

In yet other embodiments, the processing units may further include a treatment fluid distribution unit that distributes the treatment fluid into the treatment fluid supply member of each of the cleaning units, the treatment fluid distribution unit being disposed perpendicular to an end of the substrate transfer unit.

In further embodiments, the treatment fluid distribution unit may include: a chemical solution distribution unit distributing a chemical solution to the cleaning units for a chemical treating process of the substrate; and a rinse solution distribution unit distributing a rinse solution to the cleaning units for a rinsing process of the substrate.

In still further embodiments, the substrate transfer unit may have a duplex structure so that the substrate transfer unit corresponds to the upper cleaning chamber and the lower cleaning chamber of the cleaning units.

In still other embodiments of the present invention, methods of manufacturing a substrate treating apparatus include: constructing a main frame according to a layout of a process equipment in which substrate treating processes are performed; and detachably installing processing units provided in an independent module form in the main frame.

In some embodiments, the processing units may be provided in a module form that parts interacting according to functions of substrate treating processes are disposed within one independent housing.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Hereinafter, a substrate treating apparatus and a method of manufacturing the same according to preferred embodiments of the present invention will be described below in more detail with reference to the accompanying drawings. In any possible case, it is also noted that like reference numerals denote like elements in appreciating the drawings. In the following description, well-known functions or constructions are omitted in this description since they would obscure the invention in unnecessary detail.

Embodiment

Though a substrate cleaning apparatus is exemplary described in this embodiment, the present invention is not limited thereto. The present invention may be applied to a multi-chamber type semiconductor manufacturing apparatus performing different substrate treating processes except a cleaning process.

Figure 1:
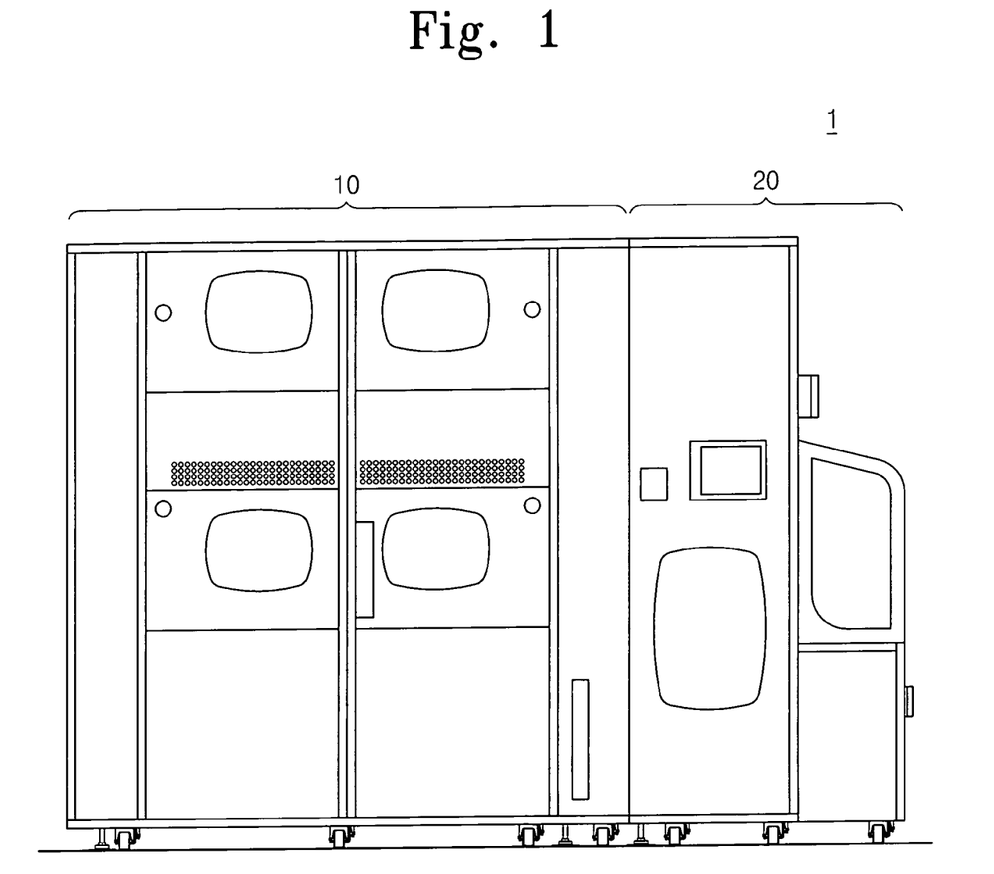
FIG. 1 is a front view of a substrate treating apparatus according to the present invention.
Figure 2:
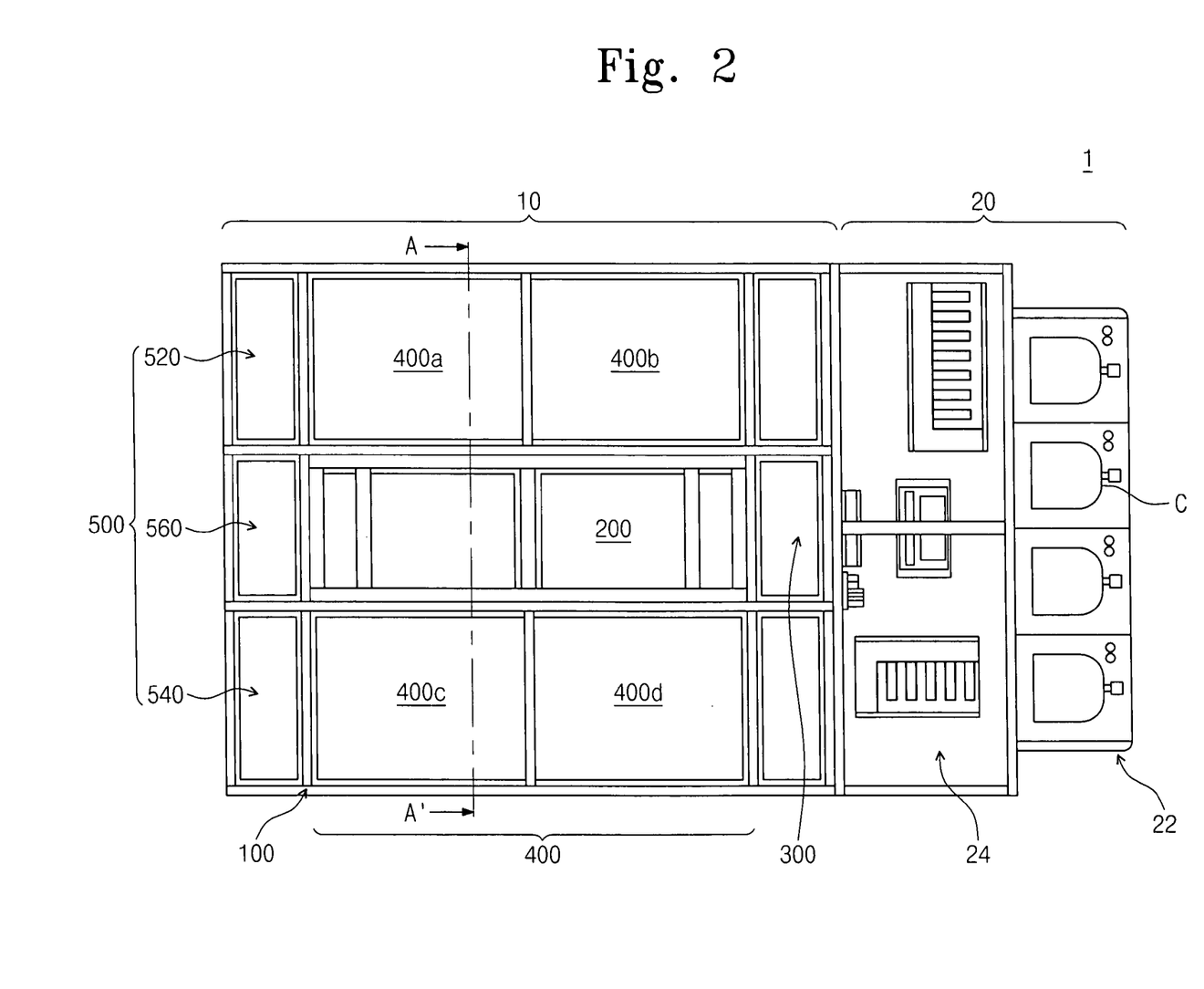
FIG. 2 is a top view of a substrate treating apparatus according to the present invention.

FIG. 1 is a front view of a substrate treating apparatus according to the present invention, and FIG. 2 is a top view of a substrate treating apparatus according to the present invention.

Referring to FIGS. 1 and 2, a substrate treating apparatus 1 for cleaning a substrate according to the present invention includes a process equipment 10 and an equipment front end module 20. In the process equipment 10, a cleaning process is performed using a single wafer processing method. The equipment front end module 20 is disposed at a front side of the process equipment 10. The equipment front end module 20 transfers the substrate between a container C receiving the substrate and the process equipment 10.

The equipment front end module 20 includes a plurality of load ports 22 and frame 24. The plurality of load ports is arranged in a line in one direction. The frame 24 is disposed between the load ports 22 and the process equipment 10. The container C receiving the substrate is disposed on each of the load ports 22 through a transfer unit (not shown) such as an overhead transfer, an overhead conveyor, or an automatic guided vehicle. A closed-type of container such as a front open unified pod (FOUP) may be used as the container C. A frame robot (not shown) and a door opener (not shown) are disposed within the frame 24. The frame robot transfers the substrate between the container C disposed on each of the load ports 22 and the process equipment 10. The door opener automatically opens and closes a door of the container C. A fan filter unit (not shown) may be disposed in the frame 24. The fan filter unit supplies clean air into the frame 24 so that a descending air current flows through the frame 24.

The process equipment 10 includes a main frame 100 and a plurality of processing units 200, 300, 400, and 500. The main frame is a structure that constitutes a framework of the process equipment 10 according to a layout of the process equipment 10. Referring to FIG. 2, the main frame 100 may include a structure having linear members. The processing units 200, 300, 400, and 500 are disposed in the main frame 100 according to the layout of the process equipment 10.

The processing units 200, 300, 400, and 500 are provided for cleaning the substrate and classified into a substrate transfer unit 200, a buffer unit 300, cleaning units 400, and a treatment solution distribution unit 500 according to functions of the cleaning process.

The substrate transfer unit 200 is disposed perpendicular to the other side of the equipment front end module 20. The buffer unit 300 is disposed between the substrate transfer unit 200 and the equipment front end module 20. The buffer unit 300 provides a space in which the substrate to be loaded/unloaded into/from the process equipment 10 temporarily stays. The cleaning units 400 (400a, 400b, 400c, and 400d) are parallelly disposed along a longitudinal direction at both sides of the substrate transfer unit 200 to perform the substrate cleaning process. The substrate transfer unit 200 transfers the substrate between the buffer unit 300 and the cleaning units 400a, 400b, 400c, and 400d and between the cleaning units 400a, 400b, 400c and 400d. The treatment fluid distribution unit 500 is disposed perpendicular to an end of the longitudinal direction of the substrate transfer unit 200. The treatment fluid distribution unit 500 distributes a treatment fluid to be supplied from a treatment fluid supply source (not shown) and used for treating the substrate into each of cleaning units 400 (400a, 400b, 400c, and 400d).

Figure 3:
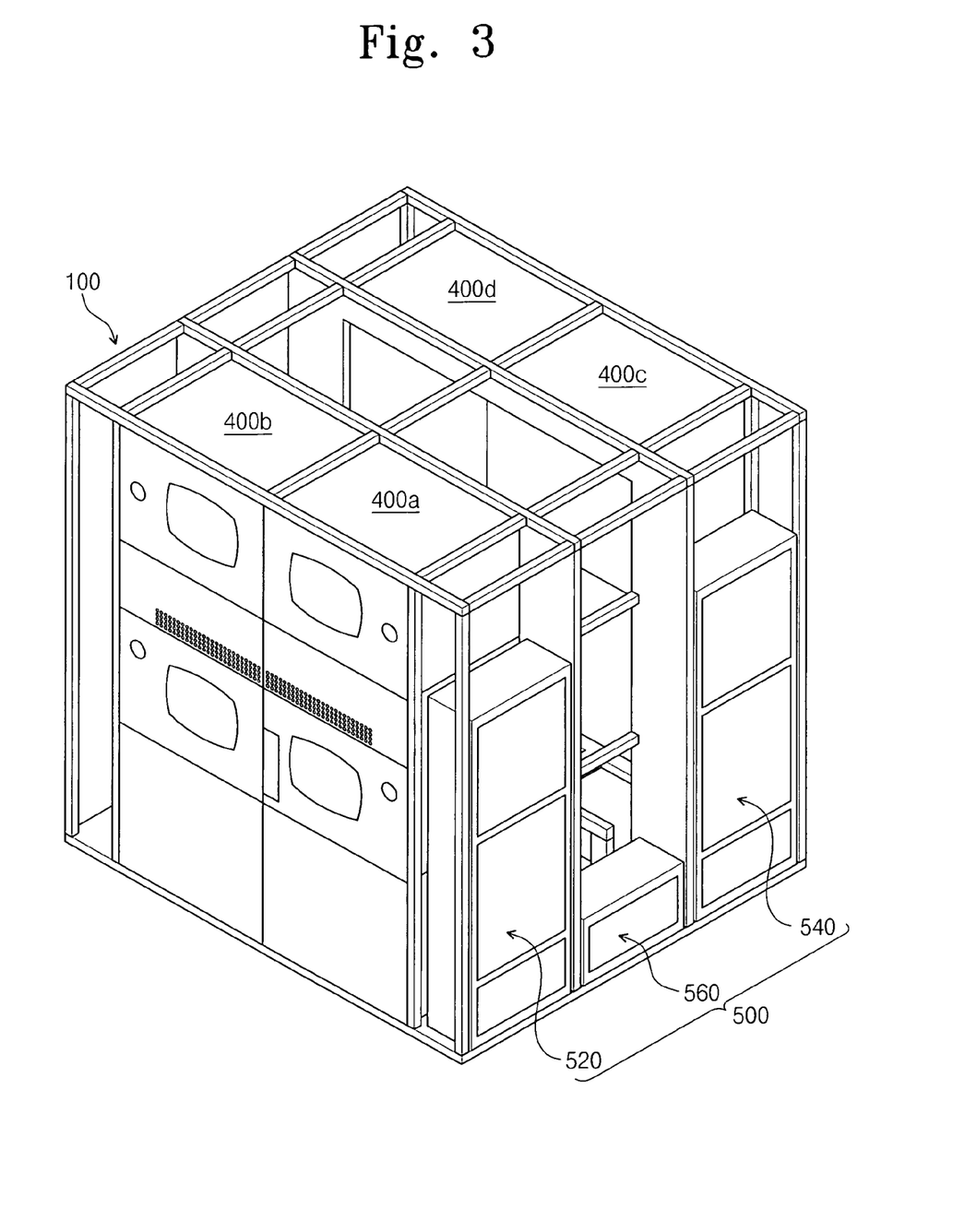
FIG. 3 is a perspective view illustrating a configuration of a process equipment of FIGS. 1 and 2.
Figure 4:
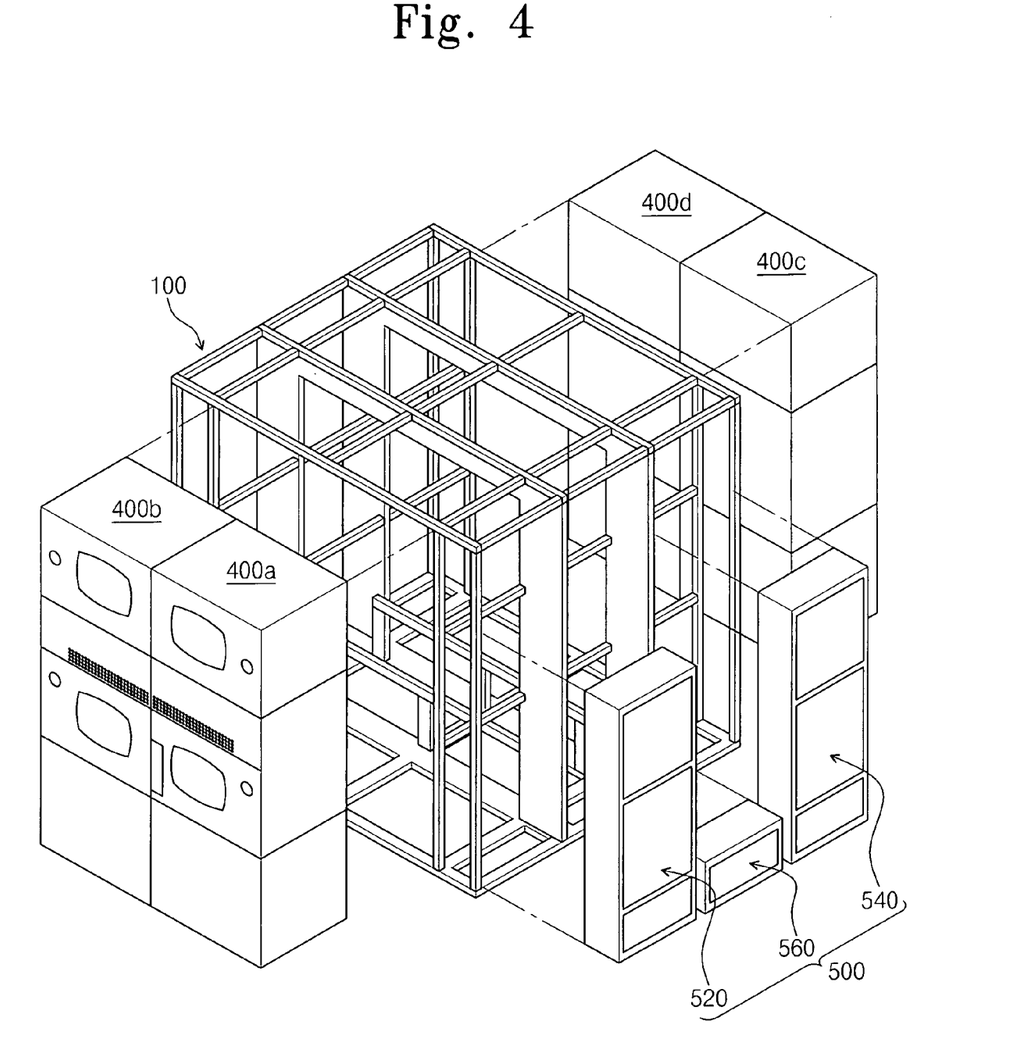
FIG. 4 is a view illustrating an assembling process of a process equipment of FIG. 3.

The substrate transfer unit 200, the buffer unit 300, the cleaning units 400, and the treatment fluid distribution unit 500 may be provided in an independent module form. A module denotes that relative parts are installed in one independent housing so as to allow each of the processing units 200, 300, 400, and 500 to independently perform each of the functions described above. Referring to FIGS. 3 and 4, the substrate transfer unit 200, the buffer unit 300, the cleaning units 400, and the treatment solution distribution unit 500 provided in the independent module form may be detachably installed in the main frame 100 according to the layout of the process equipment 10. For convenience, the substrate transfer unit 200 and the buffer unit 300 are not illustrated in FIGS. 3 and 4.

The cleaning units 400a, 400b, 400c, and 400d are parallelly disposed at the both sides of the substrate transfer unit 200. For example, as illustrated in FIG. 3, four cleaning units 400a, 400b, 400c, and 400d may be disposed two and two at the both sides of the substrate transfer unit 200. The cleaning units 400a, 400b, 400c, and 400d have the same configuration. The cleaning unit 400a and the cleaning unit 400c, and the cleaning unit 400b and the cleaning unit 400d are symmetrically disposed about the substrate transfer unit 200. One cleaning unit 400a of the cleaning units 400a, 400b, 400c, and 400d will be exemplary described below.

Figure 5:
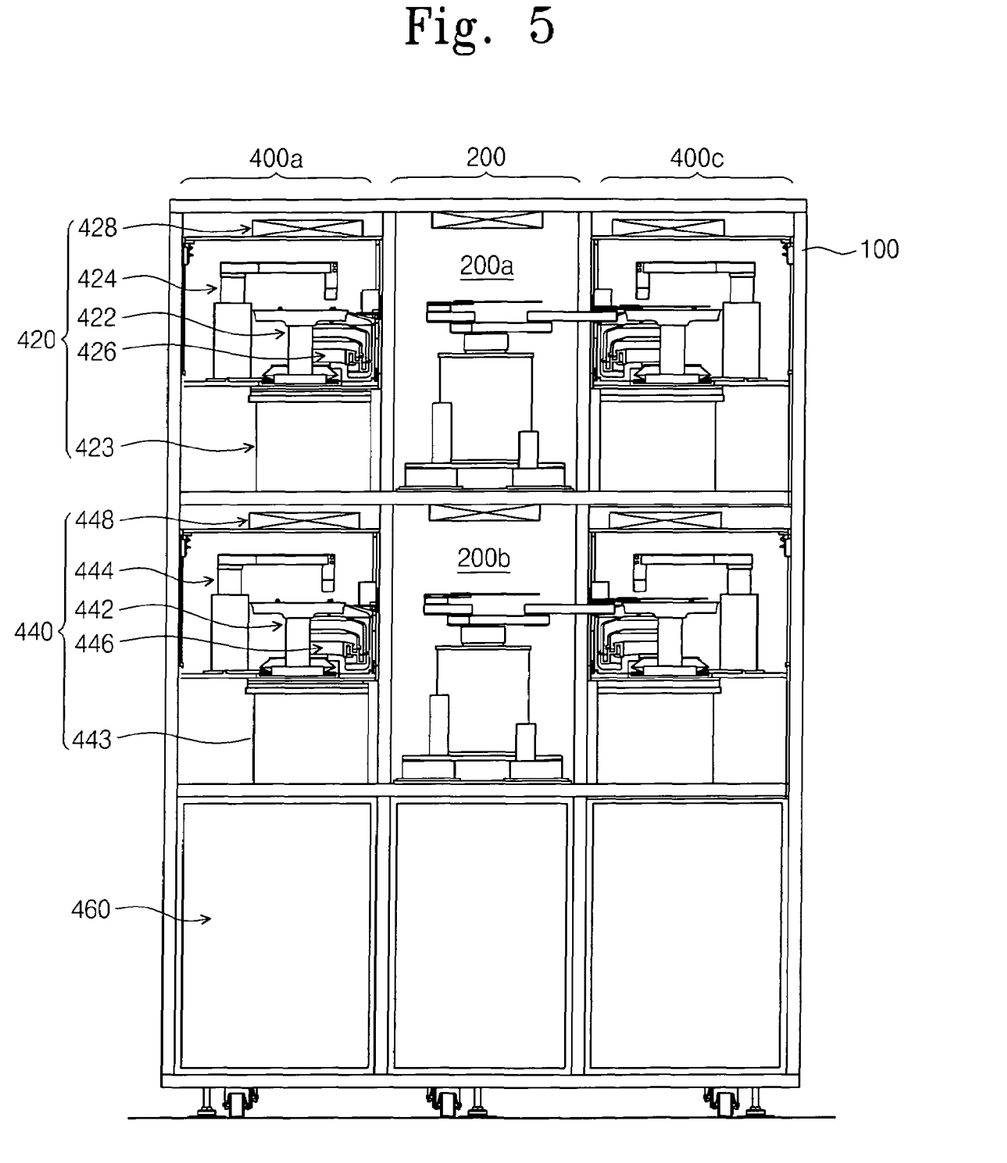
FIG. 5 is a cross-sectional view taken along line A-A' of FIG. 2.

Referring to FIG. 5, the cleaning unit 400a includes an upper cleaning chamber 420, a lower cleaning chamber 440, and a treatment fluid supply member 460. The upper cleaning chamber 420, the lower cleaning chamber 440, and the treatment fluid supply member 460 are provided as one module. The upper and lower cleaning chambers 420 and 440 are disposed in a vertical direction. In the chambers 420 and 440, the cleaning process is performed using the single wafer processing method. The substrate transfer unit 200 has a duplex structure so that a first substrate transfer unit 200a and a second substrate transfer unit 200b may correspond to the upper cleaning chamber 420 and the lower cleaning chamber 440, respectively. The treatment fluid supply member 460 is disposed under the lower cleaning chamber 440. The treatment fluid supply member 460 supplies the treatment fluid for cleaning the substrate to the upper and lower cleaning chambers 420 and 440, and discharges the treatment fluid used for the substrate treatment from the upper and lower cleaning chambers 420 and 440.

The upper cleaning chamber 420 includes a rotatable substrate support member 422, a nozzle assembly 424, and a collection member 426. The substrate is disposed on the substrate support member 422. The nozzle assembly 424 supplies the treatment fluid to the substrate disposed on the substrate support member 422. The collection member 426 is disposed around the substrate support member 422. The treatment fluid is supplied from the nozzle assembly 424 to the substrate. After the cleaning process is performed on the substrate using the treatment fluid, the used treatment solution is collected through the collection member 426. During processing, the substrate support member 422 may be rotated by a driver 423. During processing in the upper cleaning chamber 420, the clean air flows from an upper portion to a lower portion due to the descending air current created by a fan filter unit 428 disposed at an upper portion of the upper cleaning chamber 420, and the clean air is discharged through a discharging member (not shown). Since the lower cleaning chamber 440 and the upper cleaning chamber 420 have the same configuration, description of the lower cleaning chamber 440 will be omitted. Although not described here, reference numeral 422 denotes a substrate support member, reference numeral 443 denotes a driver, reference numeral 444 denotes a nozzle assembly, reference numeral 446 denotes a collection member, and reference numeral 448 denotes a fan filter unit.

Figure 6:
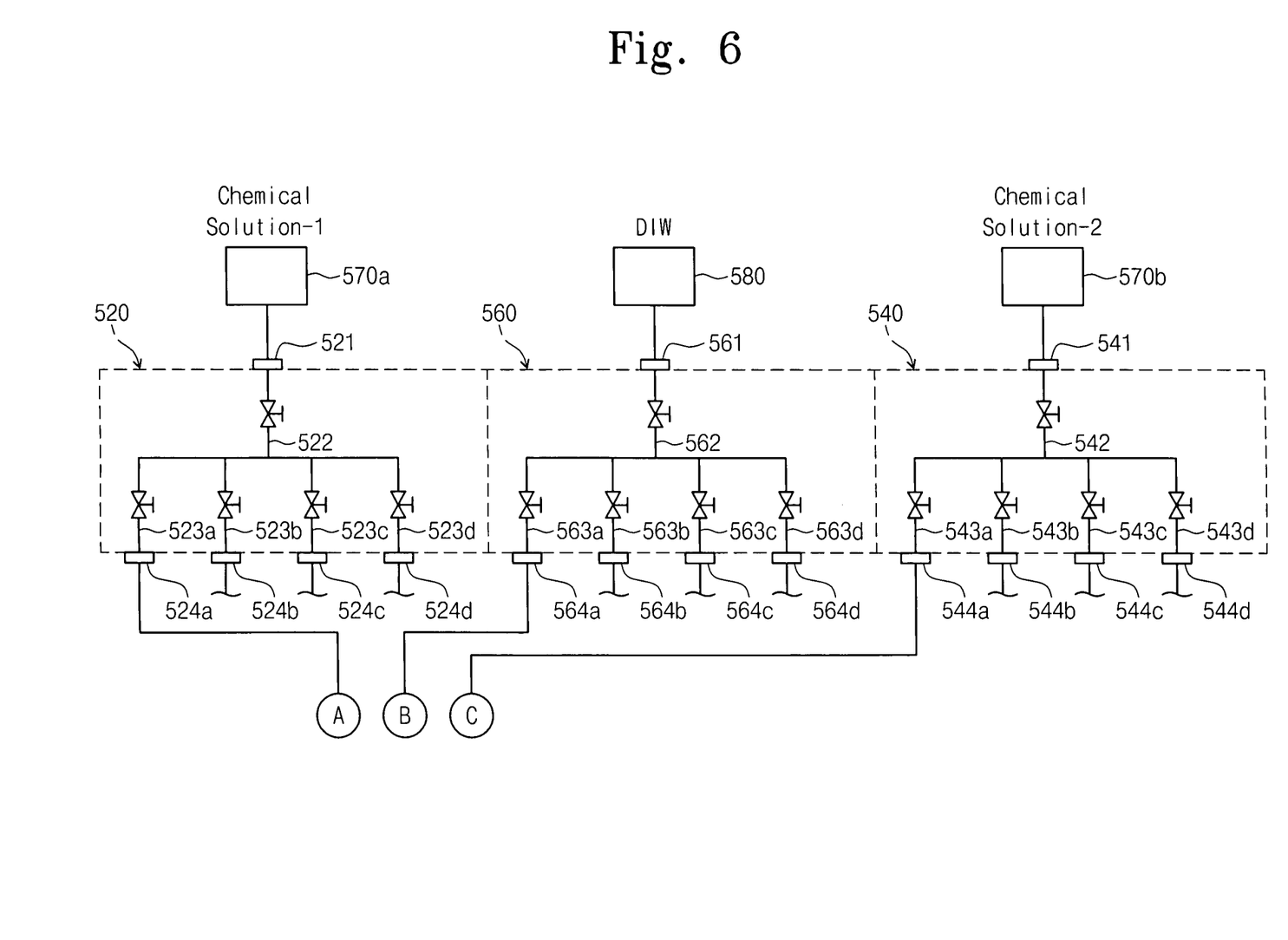
FIG. 6 is a view illustrating a pipe system of a treatment fluid distribution unit.
Figure 7:
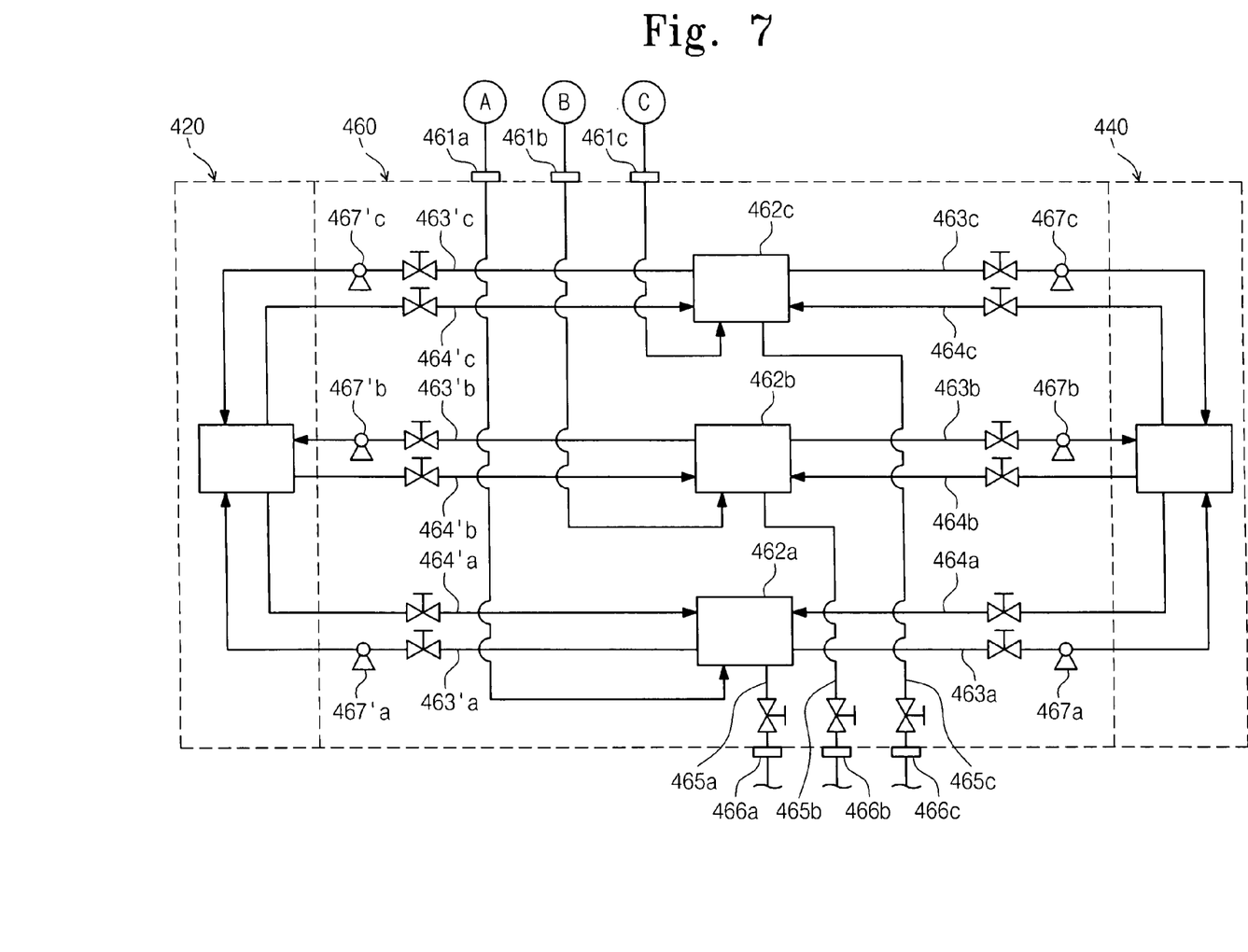
FIG. 7 is a view illustrating a pipe system of a cleaning unit.

FIG. 6 is a view illustrating a pipe system of a treatment fluid distribution unit, and FIG. 7 is a view illustrating a pipe system of a cleaning unit.

Referring to FIGS. 6 and 7, a treatment fluid supply member 460 includes inlet ports 461a, 461b, and 461c through which a chemical solution and a rinse solution for cleaning a substrate are supplied from a treatment fluid distribution unit 500 that will be described later. The chemical solution is supplied from the inlet ports 461a and 461c, and the rinse solution is supplied from the inlet port 461b. The chemical solution supplied from the inlet ports 461a and 461c is stored in chemical solution tanks 462a and 462c, and the rinse solution supplied from the inlet port 461b is stored in a rinse solution tank 462b. At least one of an HF solution, an $H_3SO_4$ solution, $NHO_3$ solution, $H_3PO_4$ solution, and an SC-1 solution (a mixed solution of $NH_4OH$, $H_2O_2$, and $H_2O$) may be used as the chemical solution in a cleaning process of the substrate. Deionized water (DIW) may be used as the rinse solution.

The chemical solution stored in the chemical solution tanks 462a and 462c is supplied to nozzle assemblies (reference numerals 424 and 444 of FIG. 5) of upper and lower cleaning chambers 420 and 440 through chemical solution supply lines 463a, 463'a, 463c, and 463'c during processing. The chemical solution used for the cleaning process in the upper and lower cleaning chambers 420 and 440 is collected into the chemical solution tanks 462a and 462c through collection members (reference numerals 426 and 446 of FIG. 5) and chemical solution discharging lines 464a, 464'a, 464c, and 464'c. The chemical solution collected into the chemical solution tanks 462a and 462c is discharged to the outside through drain lines 465a and 465c and outlet ports 466a and 466c. Also, the chemical solution collected into the chemical solution tanks 462a and 462c may be resupplied to the upper and lower cleaning chambers 420 and 440 through the chemical solution supply lines 463a, 463'a, 463c, and 463'c. The chemical solution supply lines 463a, 463'a, 463c, and 463'c and the chemical solution discharging lines 464a, 464'a, 464c, and 464'c constitute a circulation line together. Pumps 467a, 467'a, 467c, and 467'c are disposed on the chemical solution supply lines 463a, 463'a, 463c, and 463'c. In addition, a filter (not shown) and a heater (not shown) may be disposed on the chemical solution supply lines 463a, 463'a, 463c, and 463'c.

The rinse solution stored in the rinse solution tank 462b is supplied to the nozzle assemblies (reference numerals 424 and 444 of FIG. 5) of upper and lower cleaning chambers 420 and 440 through rinse solution supply lines 463b and 463'b during processing. The rinse solution used for the cleaning process in the upper and lower cleaning chambers 420 and 440 is collected into the rinse solution tank 462b through rinse solution discharging lines 464b and 464'b. The rinse solution collected into the rinse solution tank 462b is discharged to the outside through a drain line 465b and an outlet port 466b. Pumps 467b and 467'b are disposed on the rinse solution supply lines 463b and 463'b.

The treatment fluid distribution unit 500 includes a first chemical solution distribution unit 520, a second chemical solution distribution unit 540, and a rinse solution distribution unit 560. The first and second chemical solution distribution units 520 and 540 distribute the chemical solution supplied from chemical solution supply sources 570a and 570b to supply the distributed chemical solution to cleaning units 400a, 400b, 400c, and 400d. The rinse solution distribution unit 560 distributes the rinse solution supplied from a rinse solution supply source 580 to supply the distributed rinse solution to the cleaning units 400a, 400b, 400c, and 400d. Although the treatment fluid distribution unit 500 supplies the chemical solution and the rinse solution to the cleaning unit 400a of the cleaning units 400a, 400b, 400c, and 400d in FIGS. 6 and 7, the treatment fluid distribution unit 500 also supplies the chemical solution and the rinse solution to another cleaning units 400b, 400c, and 400d by the same configuration.

The first and second chemical solution distribution units 520 and 540 include inlet ports 521 and 541 through which the chemical solution supplied from the chemical solution supply sources 570a and 570b flows. The inlet ports 521 and 541 are connected to chemical solution lines 522 and 542, respectively. The chemical solution line 522 branches into four distribution lines 523a, 523b, 523c, and 523d. The distribution lines 523a, 523b, 523c, and 523d are connected to outlet ports 524a, 524b, 524c, and 524d, respectively. The outlet port 524a of the outlet ports 524a, 524b, 524c, and 524d is connected to the inlet port 461a of the treatment fluid supply member 460. The chemical solution line 542 branches into four distribution lines 543a, 543b, 543c, and 543d. The distribution lines 543a, 543b, 543c, and 543d are connected to outlet ports 544a, 544b, 544c, and 544d, respectively. The outlet port 544a of the outlet ports 544a, 544b, 544c, and 544d is connected to the inlet port 461c of the treatment fluid supply member 460.

The rinse solution distribution unit 560 includes an inlet port 561 through which the rinse solution supplied from the rinse solution supply source 580 flows. The inlet port 561 is connected to a rinse solution line 562. The rinse solution line 562 branches into four distribution lines 563a, 563b, 563c, and 563d. The distribution lines 563a, 563b, 563c, and 563d are connected to outlet ports 564a, 564b, 564c, and 564d, respectively. The outlet port 564a of the outlet ports 564a, 564b, 564c, and 564d is connected to the inlet port 461b of the treatment fluid supply member 460.

As described above, the present invention modularizes the processing units of the process equipment 10 such as the substrate transfer unit 200, the buffer unit 300, a cleaning unit 400, and treatment solution distribution unit 500, and the modularized processing units 200, 300, 400, and 500 are detachably installed in the main frame 100. Therefore, the work time and the work effort required for manufacturing the process equipment 10 can be reduced. In addition, maintenance/repair of each of the processing units 200, 300, 400, and 500 can be further easily performed.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A substrate treating apparatus comprising:
    a process equipment in which substrate treating processes are performed; and
    an equipment front end module for loading/unloading a substrate into/from the process equipment, the equipment front end module disposed at a front side of the process equipment;
    wherein the process equipment comprises:
    a main frame;
    a plurality of processing units detachably disposed on the main frame, the plurality of processing units being provided in a module form disposed within one independent housing, the plurality of processing units comprising:
        a plurality of substrate treating units for treating the substrate and a substrate transfer unit for transferring the substrate;
        at least one treatment fluid distribution unit disposed adjacent to a first substrate treating unit of the plurality of substrate treating units;
        the plurality of substrate treating units parallelly disposed at one side of the substrate transfer unit;
        wherein the plurality of substrate transfer units and the substrate treating units are detachably disposed on the main frame; and
        wherein the plurality of substrate treating units comprise one or more chambers vertically disposed over a bottom portion of the plurality of substrate treating units, the one or more chambers for receiving and discharging at least one treatment fluid, the substrate treating apparatus operable such that the at least one treatment fluid is received from the bottom portion of the plurality of substrate treating units, and wherein the bottom portion receives fluid from the at least one treatment fluid distribution unit.

2. The substrate treating apparatus of claim 1, wherein:
    the substrate transfer unit is disposed perpendicular to the equipment front end module; and
    the plurality of substrate treating units are parallelly disposed at both sides of the substrate transfer unit.

3. The substrate treating apparatus of claim 2, wherein the processing units further comprise a buffer unit detachably disposed on the main frame, and the buffer unit disposed between the substrate transfer unit and the equipment front end module for providing a space in which the substrate is to be loaded/unloaded into/from the process equipment temporarily stays.

4. The substrate treating apparatus of claim 2, wherein each of the substrate treating units comprises:
    a housing;
    wherein the one or more chambers comprise upper and lower chambers in which the substrate treating processes are performed, the upper and lower chambers being vertically disposed inside the housing; and
    wherein the bottom portion comprises a treatment fluid supply member that supplies a treatment fluid for treating the substrate to the upper and lower chambers and discharges the treatment fluid used for treating the substrate from the upper and lower chambers, the treatment fluid supply member being disposed under the lower chamber disposed inside the housing.

5. The substrate treating apparatus of claim 4, wherein the at least one treatment fluid distribution unit distributes the treatment fluid into the treatment fluid supply member of each of the substrate treating units via one or more outlet ports, the treatment fluid distribution unit being disposed perpendicular to an end of the substrate transfer unit, and wherein the treatment fluid distribution unit is detachably disposed on the main frame.

6. The substrate treating apparatus of claim 5, wherein the substrate transfer unit has a duplex structure so that the substrate transfer unit corresponds to the upper chamber the lower chamber of the substrate treating units.

7. The substrate treating apparatus of claim 6, wherein the main frame is a space form composed of linear structural materials.

8. The substrate treating apparatus of claim 1, wherein the one or more chambers and the bottom portion are disposed on the main frame such that they are simultaneously detachable from the main frame.

9. The substrate treating apparatus of claim 1, wherein the plurality of substrate transfer units are disposed on the main frame such that they are simultaneously detachable from the main frame.

10. The substrate treating apparatus of claim 1, wherein a total length of the substrate transfer unit corresponds to a sum of lengths of the substrate treating units parallelly disposed at one side of the substrate transfer unit.

11. A substrate treating apparatus comprising:
a process equipment in which a single wafer type substrate cleaning process is performed; and
an equipment front end module disposed at a front side of the process equipment, the equipment front end module loading/unloading the substrate into/from the process equipment,
wherein the process equipment comprises:
a main frame having a space form composed of linear structural materials; and
a plurality of processing units detachably disposed on the main frame, the plurality of processing units being provided in a module form disposed within one independent housing, the plurality of processing units comprising:
at least one substrate transfer unit for transferring the substrate;
a plurality of cleaning units for cleaning the substrate, wherein the plurality of cleaning units are parallelly disposed at one side of the substrate transfer unit; and
at least one treatment fluid distribution unit disposed adjacent to a first cleaning unit of the plurality of substrate treating units;
wherein the plurality of cleaning units comprise one or more chambers vertically disposed over a bottom portion of the cleaning units, the one or more chambers for receiving and discharging at least one treatment fluid, the substrate treating apparatus operable such that the at least one treatment fluid is received from the bottom portion of the plurality of substrate treating units, and wherein the bottom portion receives fluid from the at least one treatment fluid distribution unit.

12. The substrate treating apparatus of claim 11, wherein:
the substrate transfer unit is disposed perpendicular to the equipment front end module; and
the plurality of cleaning units are parallelly disposed at both sides of the substrate transfer unit.

13. The substrate treating apparatus of claim 12, wherein the processing units further comprise a buffer unit disposed between the substrate transfer unit and the equipment front end module and providing a space in which the substrate to be loaded/unloaded into/from the process equipment temporarily stays.

14. The substrate treating apparatus of claim 12, wherein each of the cleaning units comprises:
a housing;
wherein the one or more chambers upper and lower cleaning chambers vertically disposed inside the housing, the upper and lower cleaning chambers cleaning the substrate using a single wafer processing method; and
wherein the bottom portion comprises a treatment fluid supply member that supplies the treatment fluid to the upper and lower cleaning chambers and discharges the treatment fluid used for cleaning the substrate from the upper and lower cleaning chambers, the treatment fluid supply member being disposed under the lower cleaning chamber disposed inside the housing.

15. The substrate treating apparatus of claim 8, wherein the treatment fluid supply member comprises:
a circulation line circulating the treatment fluid into the upper and lower cleaning chambers; and
a pump, a filter, and a heater disposed on the circulation line.

16. The substrate treating apparatus of claim 14, wherein the substrate transfer unit has a duplex structure so that the substrate transfer unit corresponds to the upper cleaning chamber and the lower cleaning chamber of the cleaning units.

17. The substrate treating apparatus of claim 12, wherein the at least one treatment fluid distribution unit distributes the treatment fluid into the treatment fluid supply member of each of the cleaning units, where at least a portion of the at least one treatment fluid distribution unit is disposed perpendicular to an end of the substrate transfer unit.

18. The substrate treating apparatus of claim 17, wherein the treatment fluid distribution unit comprises:
a chemical solution distribution unit distributing a chemical solution to the cleaning units for a chemical treating process of the substrate; and
a rinse solution distribution unit distributing a rinse solution to the cleaning units for a rinsing process of the substrate.

* * * * *